United States Patent
Flaishman et al.

(10) Patent No.: US 11,694,721 B2
(45) Date of Patent: Jul. 4, 2023

(54) METHODS FOR WRITING HDD METADATA IN NAND FLASH

(71) Applicant: Western Digital Technologies, Inc., San Jose, CA (US)

(72) Inventors: Gilat Flaishman, Tel-Aviv (IL); Stella Achtenberg, Netanya (IL); Omer Fainzilber, Herzeliya (IL); Eran Sharon, Rishon Lezion (IL); David Robison Hall, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 55 days.

(21) Appl. No.: 17/491,379

(22) Filed: Sep. 30, 2021

(65) Prior Publication Data

US 2023/0109831 A1    Apr. 13, 2023

(51) Int. Cl.
*G11B 20/12*    (2006.01)
*G06F 3/06*    (2006.01)

(52) U.S. Cl.
CPC ............ *G11B 20/1217* (2013.01); *G06F 3/064* (2013.01); *G06F 3/0605* (2013.01); *G06F 3/0631* (2013.01); *G06F 3/0676* (2013.01); *G11B 2020/1265* (2013.01)

(58) Field of Classification Search
None
See application file for complete search history.

(56) References Cited

U.S. PATENT DOCUMENTS

| | | | | |
|---|---|---|---|---|
| 6,549,351 | B1* | 4/2003 | Reed | G11B 5/09 |
| 10,251,315 | B1* | 4/2019 | Mitchell et al. | G11B 33/128 |
| 2005/0080762 | A1* | 4/2005 | Nakashima et al. | G06F 11/1435 |
| 2007/0230025 | A1* | 10/2007 | Uchida et al. | G11B 5/59627 360/77.04 |
| 2011/0264949 | A1* | 10/2011 | Ikeuchi et al. | G06F 11/1076 714/E1.1054 |
| 2013/0182350 | A1* | 7/2013 | Kawabe et al. | G11B 5/59627 |
| 2015/0092298 | A1* | 4/2015 | Kim et al. | G06F 3/0644 360/92.1 |
| 2016/0202908 | A1* | 7/2016 | Lin et al. | G06F 3/0653 711/103 |
| 2017/0075583 | A1* | 3/2017 | Alexander et al. | G06F 12/10 |
| 2017/0092328 | A1* | 3/2017 | Anderson | G11B 27/10 |

OTHER PUBLICATIONS

Sharon, et al., Data Shaping for Improving Endurance and Reliability in Sub-20nm NAND, Flash Memory Summit, SanDisk, Aug. 2012, 24 pp.

* cited by examiner

*Primary Examiner* — Peter Vincent Agustin
(74) *Attorney, Agent, or Firm* — Patterson + Sheridan, LLP; Steven H. VerSteeg

(57) ABSTRACT

A data storage device includes a hard disk drive coupled to a printed circuit board (PCB), a volatile memory device coupled to the PCB, a non-volatile memory device coupled to the PCB, and a controller coupled to the PCB, such that the controller is in communication with the hard disk drive, the volatile memory device, and the non-volatile memory device. The controller is configured to identify patterns and/or structures of metadata for the hard disk drive, perform one or more of the following to the metadata to tailor the metadata: data shaping, content aware decoding, adaptive data trimming, and/or adaptive metablock sizing, and write the tailored metadata to the non-volatile memory device. The metadata is at least one of repeatable run out metadata, positioning error signal metadata, adjacent track interference metadata, and/or emergency power off metadata.

20 Claims, 4 Drawing Sheets

METHODS FOR WRITING HDD METADATA IN NAND FLASH

BACKGROUND

Field

Embodiments of the present disclosure generally relate to data storage devices, such as hard disk drive (HDDs), and, more specifically, efficient programming of HDD metadata to non-volatile memory of the HDD.

Description of the Related Art

In order to reduce HDD cost, track densities of the HDD have increased for each generation of HDD, which requires more sophisticated algorithms to enable reliable storage and retrieval of the data. The algorithms use various types of metadata and calibration data to overcome issues, such as head positioning errors, track miss-registration, adjacent track interference, head run out, vibrations from airflow and spindle, disk warpage, electronic noise, thermal noise, and the like. Metadata may be in a size of about 40GB for a 20+TB HDD.

A hybrid drive, such as a solid state hybrid drive (SSHD), may leverage both HDD components and solid state drive (SSD) components for increased performance and storage capacities that neither HDD nor SSD may optimally achieve by itself. For example, the hybrid drive may include a magnetic disk with a read/write head, a non-volatile memory (NVM), such as NAND flash, and volatile memory, such as static random access memory (SRAM) and dynamic random access memory (DRAM). Metadata for the hybrid drive may be stored in DRAM. However, because of the size of the metadata, the required amount of DRAM may be increased, driving increased costs and more power consumption.

Thus, there is a need in the art for an improved storage of metadata in an HDD that includes a NVM.

SUMMARY OF THE DISCLOSURE

The present disclosure generally relates to data storage devices, such as hard disk drives (HDDs), and, more specifically, efficient programming of HDD metadata to non-volatile memory of the HDD. A data storage device includes a hard disk drive coupled to a printed circuit board (PCB), a volatile memory device coupled to the PCB, a non-volatile memory device coupled to the PCB, and a controller coupled to the PCB, such that the controller is in communication with the hard disk drive, the volatile memory device, and the non-volatile memory device. The controller is configured to identify patterns and/or structures of metadata for the hard disk drive, perform one or more of the following to the metadata to tailor the metadata: data shaping, content aware decoding, adaptive data trimming, and/or adaptive metablock sizing, and write the tailored metadata to the non-volatile memory device. The metadata is at least one of repeatable run out metadata, positioning error signal metadata, adjacent track interference metadata, and/or emergency power off metadata.

In one embodiment, a data storage device includes a hard disk drive coupled to a printed circuit board, a volatile memory device coupled to the printed circuit board, a non-volatile memory device coupled to the printed circuit board, and a controller coupled to the printed circuit board, such that the controller is in communication with the hard disk drive, the volatile memory device, and the non-volatile memory device. The controller is configured to identify patterns and/or structures of metadata for the hard disk drive, perform one or more of the following to the metadata to tailor the metadata: data shaping, content aware decoding, adaptive data trimming, and/or adaptive metablock sizing, and write the tailored metadata to the non-volatile memory device. The patterns and/or structures of metadata comprises non-uniformly distributed data, data write speed requirements, and data endurance requirements.

In another embodiment, a data storage device includes a printed circuit board, one or more rotatable disks coupled to the printed circuit board, a volatile memory device coupled to the printed circuit board, a non-volatile memory device coupled to the printed circuit board, and a controller coupled to the printed circuit board, such that the controller is in communication with the one or more rotatable disks, the volatile memory device, and the non-volatile memory device. The controller is configured to identify patterns and/or structures of positioning error signal (PES) metadata or adjacent track interference (ATI) metadata for a hard disk drive, tailor the PES metadata or the ATI metadata using data shaping, and write the tailored PES metadata or ATI metadata to single level cell (SLC) memory of the non-volatile memory device.

In another embodiment, a data storage device includes a printed circuit board, one or more rotatable disks coupled to the printed circuit board, a volatile memory device coupled to the printed circuit board, a non-volatile memory device coupled to the printed circuit board, and a controller coupled to the printed circuit board, such that the controller is in communication with the one or more rotatable disks, the volatile memory device, and the non-volatile memory device. The controller is configured to identify patterns and/or structures of repeatable run out (RRO) metadata for a hard disk drive, tailor the RRO metadata using content aware decoding, and write the tailored RRO metadata to triple level cell (TLC) memory of the non-volatile memory means.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as hard disk drives (HDDs), and, more specifically, efficient programming of HDD metadata to non-volatile memory of the HDD. A data storage device includes a hard disk drive coupled to a printed circuit board (PCB), a volatile memory device coupled to the PCB, a non-volatile memory device coupled to the PCB, and a controller coupled to the PCB, such that the controller is in communication with the hard disk drive, the volatile memory device, and the non-volatile memory device. The controller is configured to identify patterns and/or structures of metadata for the hard disk drive, perform one or more of the following to the metadata to tailor the metadata: data shaping, content aware decoding, adaptive data trimming, and/or adaptive metablock sizing, and write the tailored metadata to the non-volatile memory device. The metadata is at least one of repeatable run out metadata, positioning error signal metadata, adjacent track interference metadata, and/or emergency power off metadata.

Figure 1:
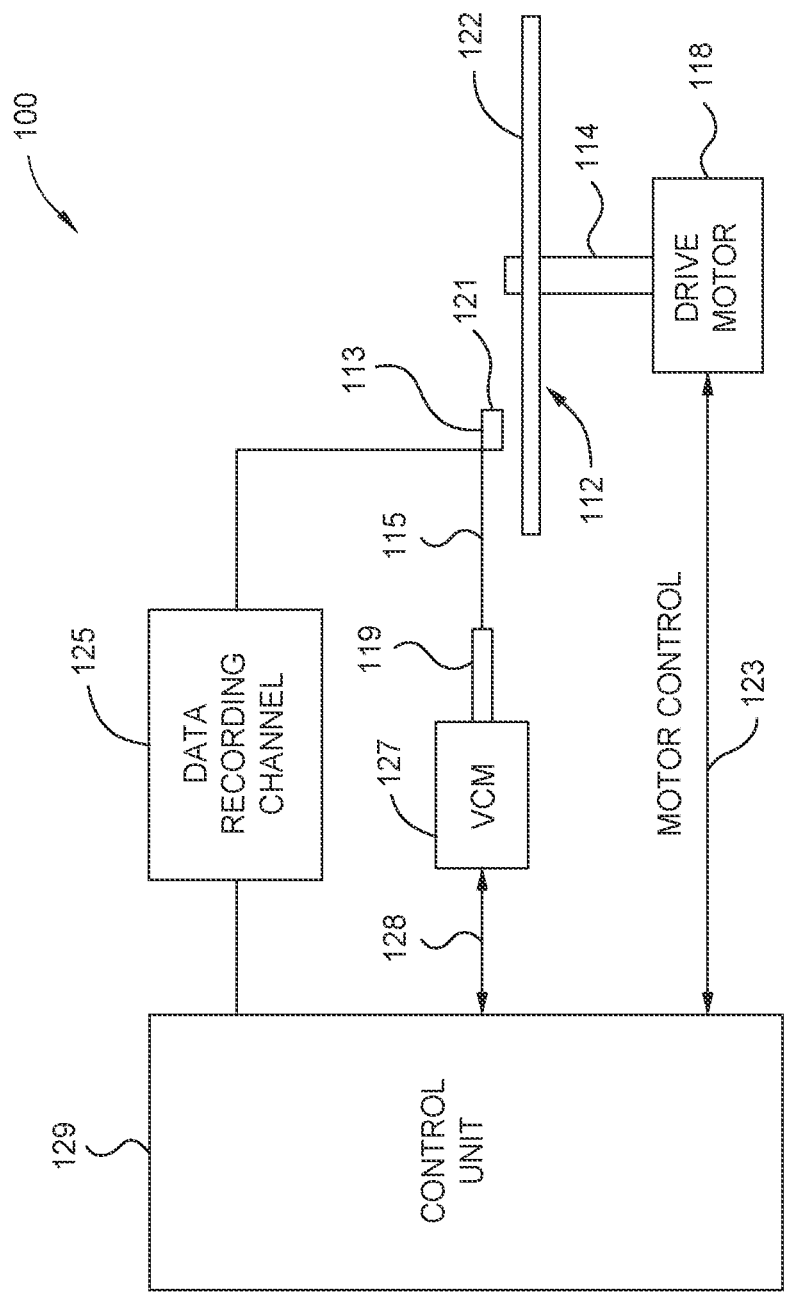
FIG. 1 is a schematic illustration of a magnetic media drive including a magnetic read head, according to certain embodiments.

FIG. 1 is a schematic illustration of a magnetic media drive 100 including a magnetic write head and a magnetic read head, according to certain embodiments. The magnetic media drive 100 may be a single drive/device or comprise multiple drives/devices. The magnetic media drive 100 includes a magnetic recording medium, such as one or more rotatable magnetic disk 112 supported on a spindle 114 and rotated by a drive motor 118. For the ease of illustration, a single disk drive is shown according to one embodiment. The magnetic recording on each magnetic disk 112 is in the form of any suitable patterns of data tracks, such as annular patterns of concentric data tracks (not shown) on the magnetic disk 112.

At least one slider 113 is positioned near the magnetic disk 112. Each slider 113 supports a head assembly 121 including one or more read/write heads, such as a write head and a read head comprising a TMR device. As the magnetic disk 112 rotates, the slider 113 moves radially in and out over the disk surface 122 so that the head assembly 121 may access different tracks of the magnetic disk 112 where desired data are written or read. Each slider 113 is attached to an actuator arm 119 by way of a suspension 115. The suspension 115 provides a slight spring force which biases the slider 113 toward the disk surface 122. Each actuator arm 119 is attached to an actuator 127. The actuator 127 as shown in FIG. 1 may be a voice coil motor (VCM). The VCM includes a coil movable within a fixed magnetic field, the direction and speed of the coil movements being controlled by the motor current signals supplied by control unit 129.

During operation of the magnetic media drive 100, the rotation of the magnetic disk 112 generates an air or gas bearing between the slider 113 and the disk surface 122 which exerts an upward force or lift on the slider 113. The air or gas bearing thus counter-balances the slight spring force of suspension 115 and supports slider 113 off and slightly above the disk surface 122 by a small, substantially constant spacing during normal operation.

The various components of the magnetic media drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from the head assembly 121 by way of recording channel 125. Certain embodiments of a magnetic media drive of FIG. 1 may further include a plurality of media, or disks, a plurality of actuators, and/or a plurality number of sliders.

Figures 2A, 2B:
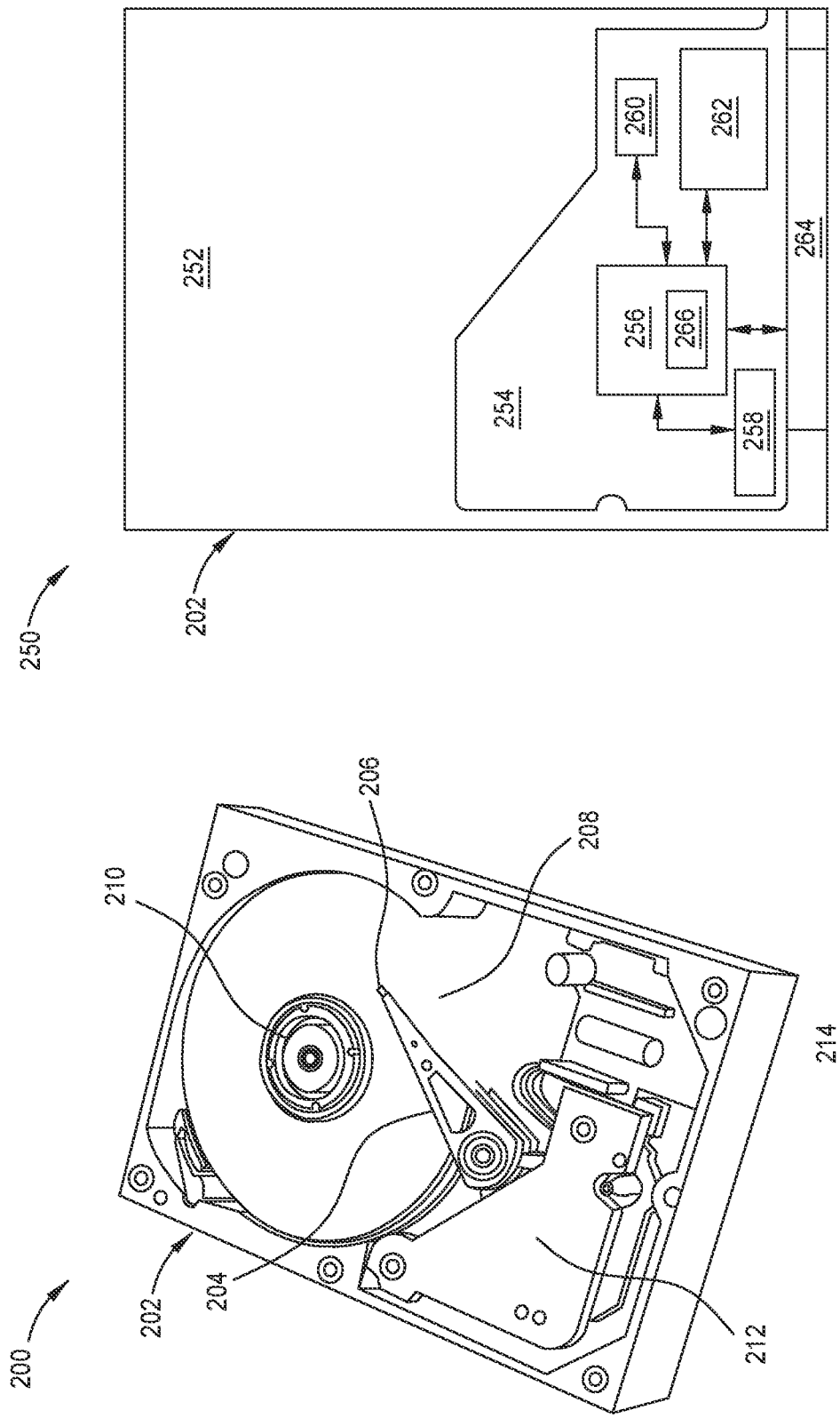
FIG. 2A is a schematic illustration of a body cavity view of an HDD, according to certain embodiments.
FIG. 2B is a schematic illustration of underbelly view of the HDD of FIG. 2A, according to certain embodiments.

FIG. 2A is a schematic illustration of a body cavity view of an HDD 202, according to certain embodiments. FIG. 2B is a schematic illustration of underbelly view of the HDD 202 of FIG. 2A, according to certain embodiments. FIGS. 2A and 2B are described collectively herein, for simplification purposes. The HDD 202 may include the magnetic media drive 100 of FIG. 1 or include similar components to the magnetic media drive 100. In some examples, the HDD 202 may include additional components not shown in FIGS. 2A and 2B for the sake of clarity. In some examples, the physical dimensions and connector configurations of the HDD 202 may conform to one or more standard form factors. Some example standard form factors include, but are not limited to, 3.5" data storage device, 2.5" data storage device, 1.8" data storage device, peripheral component interconnect (PCI), PCI-extended (PCI-X), PCI Express (PCIe) (e.g., PCIe x1, x4, x8, x16, PCIe Mini Card, Mini-PCI, etc.). In some examples, the HDD 202 may be directly coupled (e.g., directly soldered or plugged into a connector) to a motherboard of a host device.

The HDD 202 includes an actuator arm 204 coupled to a read/write head 206, a plurality of rotatable disks 208, a spindle 210, a VCM 212, a printed circuit board (PCB) cable 214, a bottom case 252, and a PCB 254 mounted to the bottom case 252. The actuator arm 204 may be a series of actuator arms, each having a read/write head configured to interact with a specific rotatable disk of the plurality of rotatable disks 208. The plurality of rotatable disks 208 may be the magnetic disk 112 of FIG. 1. The read/write head 206 is configured to program data to and read data from the plurality of rotatable disks 208, where the plurality of rotatable disks rotates about the spindle 210. The VCM 212 includes a coil movable within a fixed magnetic field, where the direction and speed of the coil movements are controlled by a VCM control unit, such as the control unit 129 of FIG. 1. The PCB cable 214 is a connection between the components of a hard drive assembly, including, but not limited to, the read/write head 206, the plurality of rotatable disks 208, and the PCB 254, such that data may be transferred between the plurality of rotatable disks 208 and the PCB 254.

The PCB 254 includes a controller 256, a PCB cable connection 258, a non-volatile memory (NVM) 262, a volatile memory 260, and a connector 264. In some examples, the PCB 254 may include additional components not shown in FIG. 2B for the sake of clarity, such as electrically conductive traces that electrically interconnect components of the PCB 254 to the other components of the HDD 202. The PCB cable connection 258 is coupled to the PCB cable 214, such that data may be transferred between the PCB 254 and the plurality of the rotatable disks 208. The PCB cable connection 258 is coupled to the controller 256.

The controller 256 may manage one or more operations of the HDD 202. For instance, controller 256 may manage the reading of data from and/or the writing of data to the NVM 262 and the plurality of rotatable disks 208. In some embodiments, when the HDD 202 receives a write command from the host device, the controller 256 may initiate a data storage command to store data to the NVM 262 or the plurality of rotatable disks 208 and monitor the progress of the data storage command. The controller 256 includes an error correction engine 266, where the error correction engine 266 is configured to generate error correction code as well as execute data shaping for data and metadata.

The connector 264 may be an interface for a connection between a host device and the HDD 202. The connector 264 may include one or both of a data bus for exchanging data with the host device and a control bus for exchanging commands with the host device. Connector 264 may operate in accordance with any suitable protocol. For example, the connector 264 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Connector 264 (e.g., the data bus, the control bus, or both) is electrically connected to the controller 256, providing an electrical connection between the host device and the controller 256, allowing data to be exchanged between the host device and the controller 256. In some examples, the electrical connection of connector 264 may also permit the HDD 202 to receive power from the host device.

The NVM 262 may include a plurality of memory devices or memory units. NVM 262 may be configured to store and/or retrieve data. For instance, a memory unit of NVM 262 may receive data and a message from controller 108 that instructs the memory unit to store the data. Similarly, the memory unit may receive a message from controller 256 that instructs the memory unit to retrieve data. In some examples, each of the memory units may be referred to as a die. In some examples, the NVM 262 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 262 may comprise a plurality of flash memory devices or memory units. NVM flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The volatile memory 260 may be used by controller 256 to store information. Volatile memory 260 may include one or more volatile memory devices. In some examples, controller 256 may use volatile memory 260 as a cache. For instance, controller 256 may store cached information in volatile memory 260 until the cached information is written to the NVM 262. Examples of volatile memory 260 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Metadata may be stored in either the NVM 262, the volatile memory 260, one or more of the plurality of rotatable disks 208, or a combination of the previously listed storage elements. Metadata may be classified based on a data type and/or a data characteristic such as non-uniformly distributed data, write speed requirements, and endurance requirements. Non-uniformly distributed data may be manipulated using data shaping and content aware decoding. For example, centralized data is a type of non-uniformly distributed data. Write speed requirements may include determining which trim and/or partition of a SLC memory, MLC memory, TLC memory, QLC memory, and the like to program data to due to a programming speed associated with the data being programmed. For example, repeatable run out (RRO) metadata, positioning error signal (PES) metadata, adjacent track interference (ATI) metadata, and emergency power off (EPO) metadata may be types of data that have write speed requirements. Endurance requirements may differ between metadata types. For example, RRO metadata may not need high endurance memory because RRO metadata is written only once and therefore can be written to TLC memory. In another example, PES metadata and ATI metadata may require high endurance memory.

It is to be understood that other types of metadata not described may be applicable to the embodiments described herein. For example, metadata that has shifts, where those shifts are centralized around one or more values, are contemplated. RRO metadata is measured and logged during production of the memory device, such as during initial testing of the plurality of rotatable disks 208, the NVM 262, and the volatile memory 260. In some examples, the RRO metadata is measured once and logged once. The PES metadata is measured and logged continuously during every sector write of the plurality of rotatable disks 208. The ATI metadata includes information counting adjacent track writes during HDD 202 operation. The EPO metadata is flushed during an ungraceful shutdown event to allow for fast recovery when power is recovered.

Typically, metadata is stored in the volatile memory 260, such as in DRAM. However, because stored metadata may be aggregated to large sizes, metadata may instead be stored in the NVM 262. The NVM 262 may have a larger capacity than the volatile memory 260 and include different memory partitions, such as SLC memory, MLC memory, TLC memory, QLC memory, PLC memory, and the like, for storage of different metadata types. For example, because RRO metadata is generated once and logged once, the RRO metadata may be programmed to TLC memory. Likewise, PES metadata, ATI metadata, and EPO metadata may be programmed to SLC memory due to endurance and speed concerns. PES metadata and ATI metadata may be stored in a first SLC memory trim and EPO metadata may be stored in a second SLC memory trim. The SLC memory trim may refer to a speed and endurance of the SLC memory. For example, the second SLC memory trim may be operationally faster than the first SLC memory trim. However, the first SLC memory trim may have a greater endurance than the first SLC memory trim.

Additionally, the metadata types may be stored in metablocks of various sizes of the relevant memory of the NVM 262. For example, EPO metadata may utilize a large metablock and the EPO metadata may be programmed to the large metablock utilizing a dual plane write. In another example, PES metadata and ATI metadata may utilize a smaller metablock than the large metablock described above, where the smaller metablock may be based in a single plane.

Furthermore, one or more types of tailoring may be employed or executed by the controller 256, or in other examples, by an iterative content aware decoder, to the metadata prior to programming the metadata to the NVM 262. The one or more types, in a non-limiting example, includes at least data shaping and content aware decoding. Data shaping leverages low data entropy to shape metadata (or in other examples, data) in a way that may induce less wear on each program/erase cycle. For example, data shaping may include converting the metadata, such that the bit distribution of the metadata includes a greater number (e.g., probability) of 1 bits than 0 bits when programmed to the NVM 262. In one example, the input sequence has a first number of 1 bits and a second number of 0 bits and the output sequence has a second number of 1 bits and a second number of 0 bits. The first number of 1 bits is less than the first number of 0 bits and the second number of 1 bits is greater than the second number of 0 bits. The input sequence and the output sequence are the same size. Data shaping may decrease the amount of programmed SLC memory cells, in one example, by a factor of about 4. Furthermore, data shaping may be executed transparently without firmware involvement since data shaping maps 4 KB of original data to 4 KB of shaped data. Thus, there is not a need to manage a logical to variable physical size mapping.

Content aware decoding leverages low data entropy and data characteristics for increased error correction code (ECC) correction capability. Although ECC data is exemplified, other data reliability data may be applicable, such as exclusive OR (XOR) parity data, and the like. The controller 256 may analyze the metadata and predict one or more characteristics about the metadata. The metadata may have at least one of sparse regions with zero padding, regions with counter behavior, regions with byte repetitions, and regions with random data with non-uniform distribution.

Zero padding refers to sections that are completely filled with zeroes for padding, which may be indicated to a decoder so that error correction capability may be improved due to knowing that there is a larger probability of zero bits than one bits. Counter behavior may refer to sections that are filled with counter data. For example, each two bytes are increased by 1 when compared to the previous byte or couple of bytes (e.g., 0×00, 0×01, 0×02, 0×03, 0×04, etc.). For counter data, a decoder of the controller 256, such as the content aware decoder or the iterative content aware decoder, may utilize the fact that many of the bits are changed slowly. For example, in the byte pattern including 0×00, 0×01, 0×02, 0×03, and 0×04, the most significant byte in each couple of bytes remains 0 for a long period. In this example, the content aware decoder may increase the probability to decode a 0 bit for the most significant byte in each couple of bytes.

Byte repetitions may refer to sections where repetitions such as constant byte values are repeated periodically or several number of bytes are repeated once in a while. The content aware decoder can track those highly repeated bytes and increase the probability that such byte values will be decoded. Random data with non-uniform distributions refers to random data that has one or more byte values that are more common than other byte values. The content aware decoder may utilize the understanding that one or more byte values are more common than other byte values to improve decoding capabilities.

By determining the one or more characteristics of the metadata, a decoder, such as the error correction engine 266 (or a decoder separate of the controller 256), may be predict one or more combinations of bits before receiving the relevant metadata, such as RRO metadata. The prediction of the one or more combinations of bits may be utilized by the error correction engine 266 to improve decoding latency and decoding accuracy.

Furthermore, the controller 256 may utilize or execute content aware decoding in conjunction or combined with data shaping. In a case where the metadata has low entropy, the metadata may be shaped so that the metadata includes a greater number of 1 bits than 0 bits. Furthermore, an estimation of the number of 1 bits may be provided to the decoder, such that the correction capability and the decoding latency may be improved. The log likelihood ratio (LLR) for each bit may be adjusted using the following formula:

$$LLR_i = \log_2\left(\frac{\Pr\{bit_i = 0/y\}}{\Pr\{bit_i = 1/y\}}\right)$$

$$= \log_2\left(\frac{\Pr\{y/bit_i = 0\} \cdot \Pr\{bit_i = 0\}}{\Pr\{y/bit_i = 1\} \cdot \Pr\{bit_i = 1\}}\right) = \log_2\left(\frac{\Pr\{y/bit_i = 0\}}{\Pr\{y/bit_i = 1\}}\right)$$

$$+ \log_2\left(\frac{\Pr\{bit_i = 0\}}{\Pr\{bit_i = 1\}}\right) = \log_2\left(\frac{\Pr\{y/bit_i = 0\}}{\Pr\{y/bit_i = 1\}}\right) + \log_2\left(\frac{1-p}{p}\right)$$

where y indicates a received bit array, $\Pr\{y/bit_i = 0\}$ is a probability that y is received when the original value of the i-th bit of the codeword is 0, and p is a probability that a bit in the codeword or metadata has a bit value of 1. For example, p may be estimated by counting the number of 1 bits in the representation of the codeword or metadata. In the final equation, $\log_2\left(\frac{\Pr\{y/bit_i = 0\}}{\Pr\{y/bit_i = 1\}}\right)$ may be determined from a LLR table stored in a relevant memory device of the HDD 202. Furthermore, $\log_2\left(\frac{1-p}{p}\right)$ is a correction term determined by the probability of 1 bits in the codeword or metadata.

In one example, PES metadata may be tailored by performing data shaping, adaptive data trimming, or adaptive metablock sizing. In another example, EPO metadata may be tailored by performing adaptive data trimming or adaptive metablock sizing. In yet another example, RRO metadata may be tailored by performing data shaping or content aware decoding.

In one example, tailoring PES metadata or ATI metadata includes performing at least two of data shaping, adaptive data trimming, and/or adaptive metablock sizing. In another example, tailoring EPO metadata includes performing adaptive data trimming and adaptive metablock sizing. In yet another embodiment, tailoring RRO metadata includes performing data shaping and content aware decoding.

Figure 3:
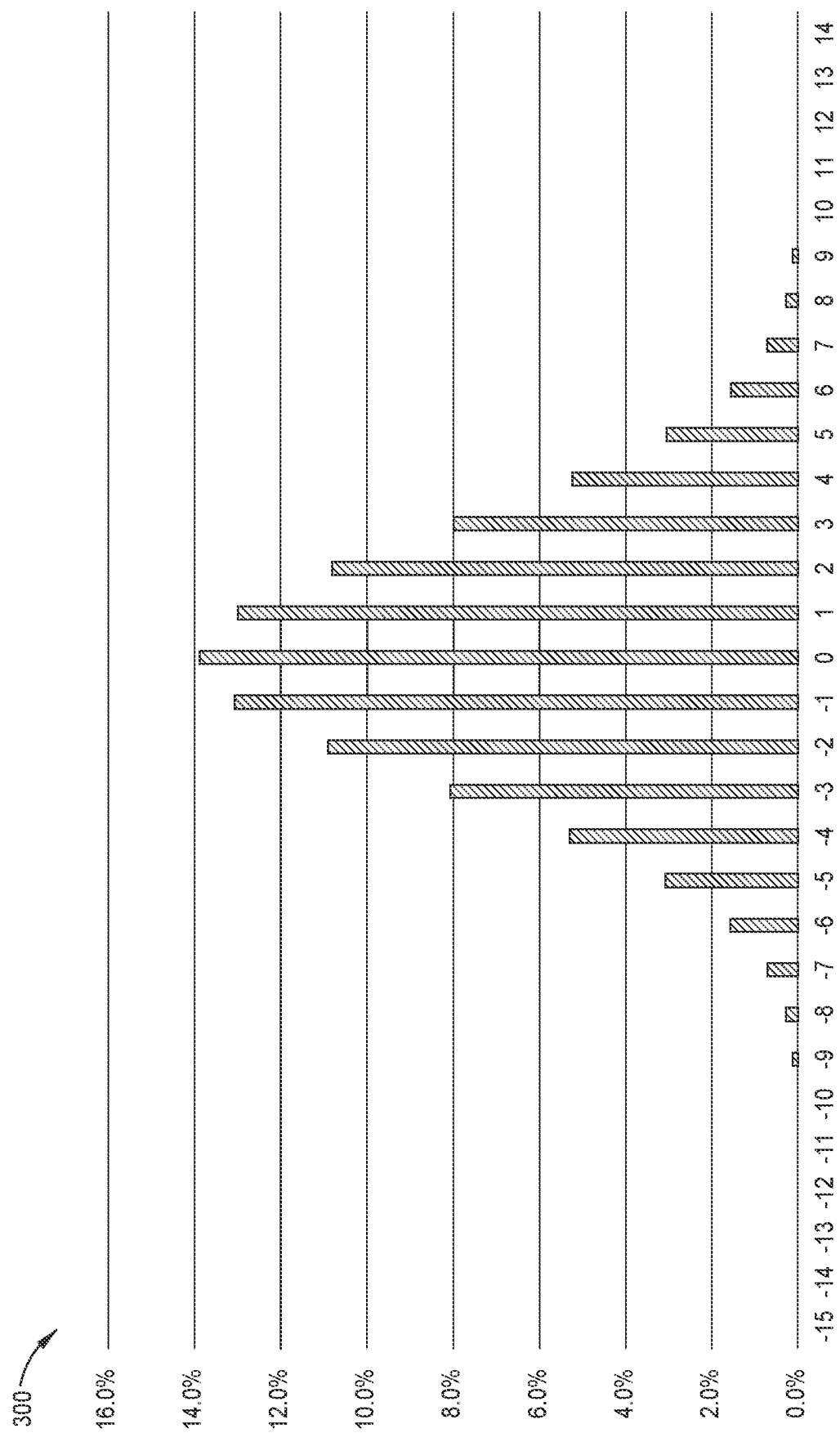
FIG. 3 is a graph illustrating a repeatable run out (RRO) metadata value distribution, according to certain embodiments.

FIG. 3 is a graph 300 illustrating a repeatable run out (RRO) metadata value distribution, according to certain embodiments. The RRO metadata value distribution is dominated by zero and near-zero values. The skewed distributions towards the zero and near-zero values allows for effective compression techniques, such as data shaping and content aware decoding, to be utilized on the RRO metadata. RRO data includes correction values (or shifts) for aligning the head position of a head assembly, such as the head assembly 121 of FIG. 1, to the actual track center. Thus, when creating a histogram of the RRO values, a distribution around zero with zero and near-zero values is generated. The X-axis of the graph 300 corresponds to the correction values and the Y-axis of the graph 300 corresponds to the population (as in histogram) for each one of the values.

Figure 4:
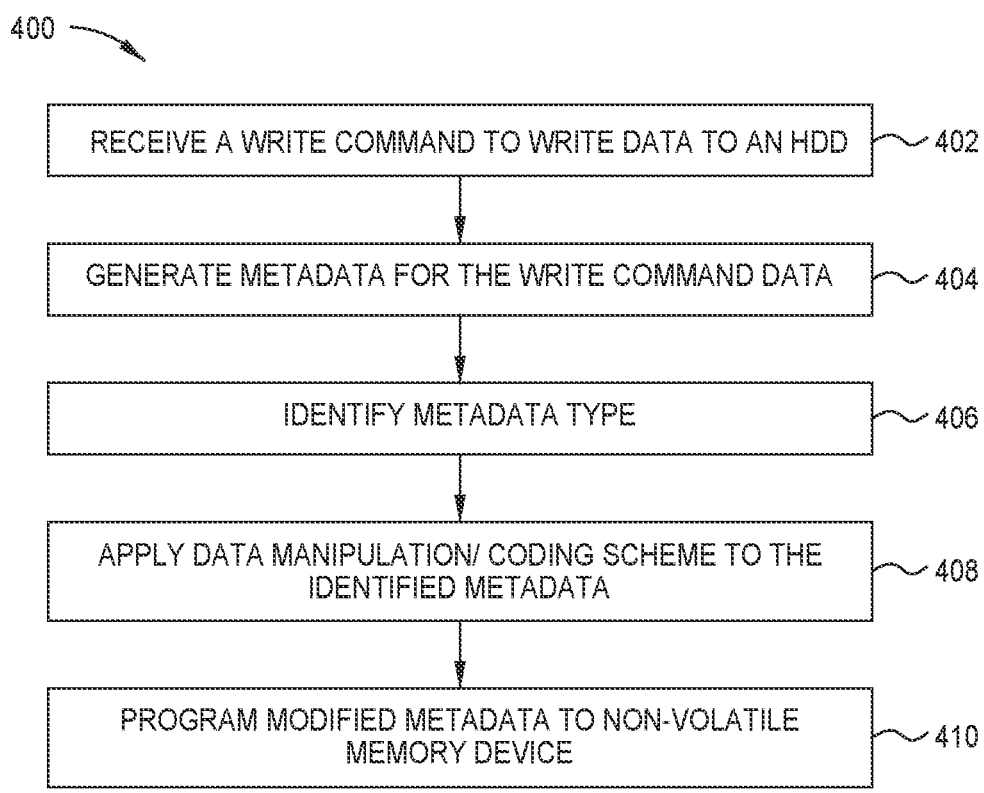
FIG. 4 is a flow diagram illustrating a method of programming metadata to non-volatile memory of an HDD, according to certain embodiments.

FIG. 4 is a flow diagram illustrating a method 400 of programming metadata to non-volatile memory, such as the NVM 262 of FIG. 2B, of an HDD, such as the HDD 202 of FIGS. 2A and 2B, according to certain embodiments. Aspects of FIGS. 2A and 2B may be referenced in the description herein for exemplary purposes. For example, method 400 may be employed or executed by the controller 256.

At block 402, the controller 256 receives a write command from a host device to write data to the HDD 202. Based on the write command, the write command data may be programmed to either the NVM 262 or one or more of the plurality of rotatable disks 208. At block 404, the controller 256 generates metadata for the write command data. The metadata may either be RRO metadata, PES metadata, ATI metadata, EPO metadata, or a combination of the previously listed metadata. At block 406, the controller 256 identifies the metadata type.

At block 408, the controller 256 applies a data manipulation and/or a coding scheme to the identified metadata type. The data manipulation and/or coding scheme may be executed by the error correction engine 266. For example, PES metadata and ATI metadata may be tailored by performing data shaping to the metadata. In another example, RRO metadata may be tailored by performing data shaping, content aware decoding, or both data shaping and content aware decoding.

At block 410, the controller 256 programs the modified metadata to the relevant memory location of the NVM 262. For example, the controller 256 may program the PES metadata and the ATI metadata to a first SLC memory trim and the EPO metadata to a second SLC memory trim, where the first SLC memory trim has a greater endurance, but a lower speed than the second SLC memory trim. The PES metadata and the ATI metadata may be programmed in a metablock located on a single plane, whereas the EPO metadata may be programmed to a larger metablock, when compared to the metablock associated with the PES metadata and the ATI metadata, using a dual plane write. Likewise, the controller 256 may program the RRO metadata to the TLC memory.

By identifying, tailoring, and programming the different types of metadata, the HDD including NVM may have more efficient programming, reduced NVM cost, reduced volatile memory cost, improved lifetime, and reduced power consumption.

In one embodiment, a data storage device includes a hard disk drive coupled to a printed circuit board, a volatile memory device coupled to the printed circuit board, a non-volatile memory device coupled to the printed circuit board, and a controller coupled to the printed circuit board, such that the controller is in communication with the hard disk drive, the volatile memory device, and the non-volatile memory device. The controller is configured to identify patterns and/or structures of metadata for the hard disk drive, perform one or more of the following to the metadata to tailor the metadata: data shaping, content aware decoding, adaptive data trimming, and/or adaptive metablock sizing, and write the tailored metadata to the non-volatile memory device. The patterns and/or structures of metadata comprises non-uniformly distributed data, data write speed requirements, and data endurance requirements.

The metadata is at least one of repeatable run out (RRO) metadata, positioning error signal (PES) metadata, adjacent track interference (ATI) metadata, emergency power off (EPO) metadata, and/or metadata centered around one or more values. The non-volatile memory device comprise single level cells (SLC) or triple level cells (TLC). The SLC comprises a first SLC trim and a second SLC trim. The EPO metadata is stored in the first SLC trim. The PES metadata and the ATI metadata are stored in the second SLC trim. The RRO metadata is stored in TLC. The tailoring includes tailoring EPO metadata using a first single level cell (SLC) trim that has a first speed. The tailoring includes tailoring PES metadata or ATI metadata using a second SLC trim that has a second speed slower than the first speed. The second SLC trim has a higher endurance than the first SLC trim. The writing the tailored EPO metadata includes writing to a dual plane. The writing the tailored PES metadata or ATI metadata includes writing to a single plane. The tailoring includes performing at least two of data shaping, adaptive data trimming, and/or adaptive metablock sizing to the PES metadata or the ATI metadata. The tailoring includes performing adaptive data trimming and adaptive metablock sizing to the EPO metadata. The tailoring includes performing data shaping and content aware decoding to the RRO metadata.

In another embodiment, a data storage device includes a printed circuit board, one or more rotatable disks coupled to the printed circuit board, a volatile memory device coupled to the printed circuit board, a non-volatile memory device coupled to the printed circuit board, and a controller coupled to the printed circuit board, such that the controller is in communication with the one or more rotatable disks, the volatile memory device, and the non-volatile memory device. The controller is configured to identify patterns and/or structures of positioning error signal (PES) metadata or adjacent track interference (ATI) metadata for a hard disk drive, tailor the PES metadata or the ATI metadata using data shaping, and write the tailored PES metadata or ATI metadata to single level cell (SLC) memory of the non-volatile memory device.

The controller includes an error correction engine, and wherein the error correction engine is configured to execute the data shaping. The tailoring includes converting an input sequence having a number of programmed bits greater than a number of erased bits to an output sequence having a second number of programmed bits less than a second number of erased bit. The input sequence and the output sequence are equal in data size.

In another embodiment, a data storage device includes a printed circuit board, one or more rotatable disks coupled to the printed circuit board, a volatile memory device coupled to the printed circuit board, a non-volatile memory device coupled to the printed circuit board, and a controller coupled to the printed circuit board, such that the controller is in communication with the one or more rotatable disks, the volatile memory device, and the non-volatile memory device. The controller is configured to identify patterns and/or structures of repeatable run out (RRO) metadata for a hard disk drive, tailor the RRO metadata using content aware decoding, and write the tailored RRO metadata to triple level cell (TLC) memory of the non-volatile memory means.

The identified patterns and/or structures comprises at least one of sparse regions with zero padding, regions with counter behavior, regions with byte repetitions, and regions with random data with non-uniform distribution. The controller includes a decoder. The decoder is configured to receive the identified patterns and/or structures and predict one or more combinations of bits based on the received identified patterns and/or structures before decoding the RRO metadata.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a hard disk drive coupled to a printed circuit board;
a volatile memory device coupled to the printed circuit board;
a non-volatile memory device coupled to the printed circuit board;
a controller coupled to the printed circuit board, wherein the controller is in communication with the hard disk drive, the volatile memory device, and the non-volatile memory device, wherein the controller is configured to:
identify patterns and/or structures of metadata for the hard disk drive, wherein the patterns and/or structures of metadata comprises non-uniformly distributed data, data write speed requirements, and data endurance requirements;
perform one or more of the following to the metadata to tailor the metadata: data shaping, content aware decoding, adaptive data trimming, and/or adaptive metablock sizing; and
write the tailored metadata to the non-volatile memory device.

2. The data storage device of claim 1, wherein the metadata is at least one of repeatable run out (RRO) metadata, positioning error signal (PES) metadata, adjacent track interference (ATI) metadata, emergency power off (EPO) metadata, and/or metadata centered around one or more values.

3. The data storage device of claim 2, wherein the non-volatile memory device comprises single level cells (SLC) or triple level cells (TLC), and wherein the SLC comprises a first SLC trim and a second SLC trim.

4. The data storage device of claim 3, wherein the EPO metadata is stored in the first SLC trim.

5. The data storage device of claim 4, wherein the PES metadata and the ATI metadata are stored in the second SLC trim.

6. The data storage device of claim 2, wherein the RRO metadata is stored in TLC.

7. The data storage device of claim 2, wherein the tailoring comprises tailoring EPO metadata using a first single level cell (SLC) trim that has a first speed.

8. The data storage device of claim 7, wherein the tailoring comprises tailoring PES metadata or ATI metadata using a second SLC trim that has a second speed slower than the first speed.

9. The data storage device of claim 8, wherein the second SLC trim has a higher endurance than the first SLC trim.

10. The data storage device of claim 2, wherein writing the tailored EPO metadata comprises writing to a dual plane.

11. The data storage device of claim 2, wherein writing the tailored PES metadata or ATI metadata comprises writing to a single plane.

12. The data storage device of claim 2, wherein the tailoring comprises performing at least two of data shaping, adaptive data trimming, and/or adaptive metablock sizing to the PES metadata or the ATI metadata.

13. The data storage device of claim 2, wherein the tailoring comprises performing adaptive data trimming and adaptive metablock sizing to the EPO metadata.

14. The data storage device of claim 2, wherein the tailoring comprises performing data shaping and content aware decoding to the RRO metadata.

15. A data storage device, comprising:
a printed circuit board;
one or more rotatable disks coupled to the printed circuit board;
a volatile memory device coupled to the printed circuit board;
a non-volatile memory device coupled to the printed circuit board; and
a controller coupled to the printed circuit board, such that the controller is in communication with the one or more rotatable disks, the volatile memory device, and the non-volatile memory device, wherein the controller is configured to:
identify patterns and/or structures of positioning error signal (PES) metadata or adjacent track interference (ATI) metadata for a hard disk drive;
tailor the PES metadata or the ATI metadata using data shaping; and
write the tailored PES metadata or ATI metadata to single level cell (SLC) memory of the non-volatile memory device.

16. The data storage device of claim 15, wherein the controller comprises an error correction engine, and wherein the error correction engine is configured to execute the data shaping.

17. The data storage device of claim 15, wherein the tailoring comprises converting an input sequence having a number of programmed bits greater than a number of erased bits to an output sequence having a second number of programmed bits less than a second number of erased bits, and wherein the input sequence and the output sequence are equal in data size.

18. A data storage device, comprising:
a printed circuit board;
one or more rotatable disks coupled to the printed circuit board;

a volatile memory device coupled to the printed circuit board;

a non-volatile memory means coupled to the printed circuit board; and a controller coupled to the printed circuit board such that the controller is in communication with the one or more rotatable disks, the volatile memory device, and the non-volatile memory means, wherein the controller is configured to:

identify patterns and/or structures of repeatable run out (RRO) metadata for a hard disk drive;

tailor the RRO metadata using content aware decoding; and write the tailored RRO metadata to triple level cell (TLC) memory of the non-volatile memory means.

19. The data storage device of claim 18, wherein the identified patterns and/or structures comprises at least one of:

sparse regions with zero padding;
regions with counter behavior;
regions with byte repetitions; and
regions with random data with non-uniform distribution.

20. The data storage device of claim 19, wherein the controller comprises a decoder, wherein the decoder is configured to:

receive the identified patterns and/or structures; and
predict one or more combinations of bits based on the received identified patterns and/or structures before decoding the RRO metadata.

\* \* \* \* \*